(12) United States Patent
Hasegawa et al.

(10) Patent No.: US 6,975,039 B2
(45) Date of Patent: Dec. 13, 2005

(54) METHOD OF FORMING A BALL GRID ARRAY PACKAGE

(75) Inventors: Kiyoshi Hasegawa, Tokyo (JP); Fumihiko Ooka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/712,054

(22) Filed: Nov. 14, 2003

(65) Prior Publication Data

US 2004/0094833 A1 May 20, 2004

Related U.S. Application Data

(62) Division of application No. 09/917,712, filed on Jul. 31, 2001, now Pat. No. 6,677,219, which is a division of application No. 09/358,366, filed on Jul. 21, 1999, now Pat. No. 6,300,685.

(30) Foreign Application Priority Data

Aug. 20, 1998 (JP) .................................. 10-234614

(51) Int. Cl.[7] ...................... H01L 23/495; H01L 23/48; H01L 23/52; H01L 29/40
(52) U.S. Cl. ...................... 257/784; 257/668; 257/670; 257/690; 257/738; 257/778
(58) Field of Search .............................. 257/668, 670, 257/680, 690, 738, 780, 784, 777, 778, 702, 257/703

(56) References Cited

U.S. PATENT DOCUMENTS

| | | | |
|---|---|---|---|
| 5,394,009 A | 2/1995 | Loo | |
| 5,627,408 A | 5/1997 | Kusumi | |
| 5,777,391 A | 7/1998 | Nakamura et al. | |
| 5,793,104 A | 8/1998 | Kirkman | |
| 5,858,815 A | 1/1999 | Heo et al. | |
| 5,864,174 A | 1/1999 | Yamada et al. | |
| 5,950,070 A | 9/1999 | Razon et al. | |
| 5,956,233 A | 9/1999 | Yew et al. | |
| 5,976,916 A | 11/1999 | Kuwamura et al. | |
| 6,013,948 A | 1/2000 | Akram et al. | |
| 6,207,477 B1 * | 3/2001 | Motooka et al. | 438/113 |
| 6,242,283 B1 | 6/2001 | Lo et al. | |
| 6,677,219 B2 * | 1/2004 | Hasegawa et al. | 438/458 |
| 2001/0001714 A1 * | 5/2001 | Motooka et al. | 438/1 |
| 2004/0094833 A1 * | 5/2004 | Hasegawa et al. | 257/698 |

FOREIGN PATENT DOCUMENTS

| | | |
|---|---|---|
| JP | 358092230 | 6/1983 |
| JP | 9-74154 | 3/1997 |

* cited by examiner

*Primary Examiner*—Nathan J. Flynn
*Assistant Examiner*—Victor A. Mandala, Jr.
(74) *Attorney, Agent, or Firm*—Volentine Francos & Whitt, PLLC

(57) ABSTRACT

A semiconductor package includes a semiconductor chip having a major surface and first pads formed on the major surface. The semiconductor package also includes a package substrate having (a) opposite first and second major surfaces, (b) a side surface extending between the first and second major surfaces, (c) a pad forming region adjacent to and along the side surface, (d) second pads formed on the pad forming region, (e) external electrodes formed on the first major surface of the package substrate, wherein the second major surface of the package substrate is fixed to the major surface of the semiconductor chip, and wherein the external electrodes are electrically connected to the second pads. The semiconductor package further includes bonding wires electrically connecting the first pads to the second pads and a sealing material covering the bonding wires and first and second pads.

16 Claims, 16 Drawing Sheets

METHOD OF FORMING A BALL GRID ARRAY PACKAGE

This is a divisional of U.S. patent application Ser. No. 09/917,712, filed Jul. 31, 2001, now U.S. Pat. No. 6,677,219, which is a divisional of U.S. patent application Ser. No. 09/358,366, filed Jul. 21,1999, now U.S. Pat. No. 6,300,685 issued on Oct. 9, 2001, the entire contents of each of which are hereby incorporated herein by reference for all purposes as if fully set forth herein.

BACKGROUND OF THE INVENTION

1. Field of the Invention

The present invention generally relates to a semiconductor package, and more particularly, to a semiconductor package having a Ball Grid Array structure.

This application relies for priority on Japanese patent application, Serial Number 234614/1998, filed Aug. 20, 1998, which is incorporated herein by reference in its entirety.

2. Description of the Related Art

An example of a conventional semiconductor device using a BGA (Ball Grid Array) structure is shown in FIG. 1. As shown in FIG. 1, a semiconductor device 40 (i.e., semiconductor package) is made up of a printed circuit board 14, a semiconductor element 16 (e.g., a semiconductor chip) and a resin 13.

The printed circuit board 14 has printed wirings formed on both front and back surfaces thereof and solder balls 12 which are arrayed along all sides of the printed circuit board 14 and are lectrically connected to the wirings of the back surface of the printed circuit board 14. The semiconductor element 16 is placed on the front surface of the printed circuit board 14 so that a front surface 16a thereof on which circuits are formed faces upward. The semiconductor element 16 is electrically connected to wirings formed on the printed circuit board 14 through bonding wires 18 made of gold. The resin 13 protects the semiconductor element 16, bonding wires 18, and connection areas where the bonding wires 18 are connected to the wirings formed on the printed circuit board 14 from an external environment.

Another conventional semiconductor device 42 which is intended to reduce a device thickness and size is shown in FIG. 2. In the semiconductor device 42, a semiconductor element 16 is placed on the front surface of a printed circuit board 14 so that a surface 16a on which circuits are formed faces downward. Electrodes formed on the semiconductor element 16 are connected to electrodes on the printed circuit board 14 through solder bumps 15. The space located between the surface 16a and the printed circuit board 14 is sealed by an insulating resin 13.

In recent years, there has been a strong demand to further miniaturize the semiconductor device. In the cas of the semiconductor device 40 shown in FIG. 1, it is necessary to set the length of the bonding wire to a relatively long length to avoid the possibility where the bonding wire 18 is shorted to the semiconductor element 16 by physically contacting the edge of the semiconductor element 16. Therefore, it is also necessary to use a bonding wire which has a relatively high wire-bond loop profile to avoid imperfect contact or breaking of the wire. However; in such a technique, the relatively long bonding wire 18 causes the thickness of the resin 13 become greater than that of the printed circuit board 14 and thus the total thickness of the semiconductor device 40 increases. This means that it is difficult to reduce the size of the semiconductor device as a whole.

In the case of the semiconductor device 40 shown in FIG. 2, the size of the printed circuit board 14 can be set to nearly the same as that of the semiconductor element 16. However, since the bump electrodes, which are provided on the printed circuit board 14 or the semiconductor element 16, are used for connecting the printed circuit board 14 and the semiconductor element 16, this technique has an low manufacturing-efficiency and is less cost-effective when compared to the wire-bonding technique.

Consequently, there has been a need for an improved semiconductor device.

SUMMARY OF THE INVENTION

It is an object of the present invention is to provide a semiconductor package having a smaller size.

It is another object of the present invention is to provide a method of fabricating a semiconductor package that may be reduced in overall size.

It is another object of the present invention is to provide a semiconductor package that is well cost-effective to produce.

It is another object of the present invention is to provide a semiconductor package that has a high manufacturing-efficiency.

According to one aspect of the present invention, for achieving one or more of the above objects, there is provided a semiconductor package which includes a semiconductor chip having a major surface and first pads formed on the major surface. The semiconductor package also includes a package substrate having (a) opposite first and second major surfaces, (b) a side surface extending between the first and second major surfaces, (c) a pad forming region adjacent to and along the side surface, (d) second pads formed on the pad forming region, (e) external electrodes formed on the first major surface of the package substrate, wherein the second major surface of the package substrate is fixed to the major surface of the semiconductor chip, and wherein the external electrodes are electrically connected to the second pads. The semiconductor package further includes bonding wires electrically connecting the first pads to the second pads and a sealing material covering the bonding wires and first and second pads.

The above and further objects and novel features of the invention will more fully appear from the following detailed description, appended claims, and the accompanying drawings.

DETAILED DESCRIPTION OF THE PREFERRED EMBODIMENTS

First Preferred Embodiment

Figure 1:
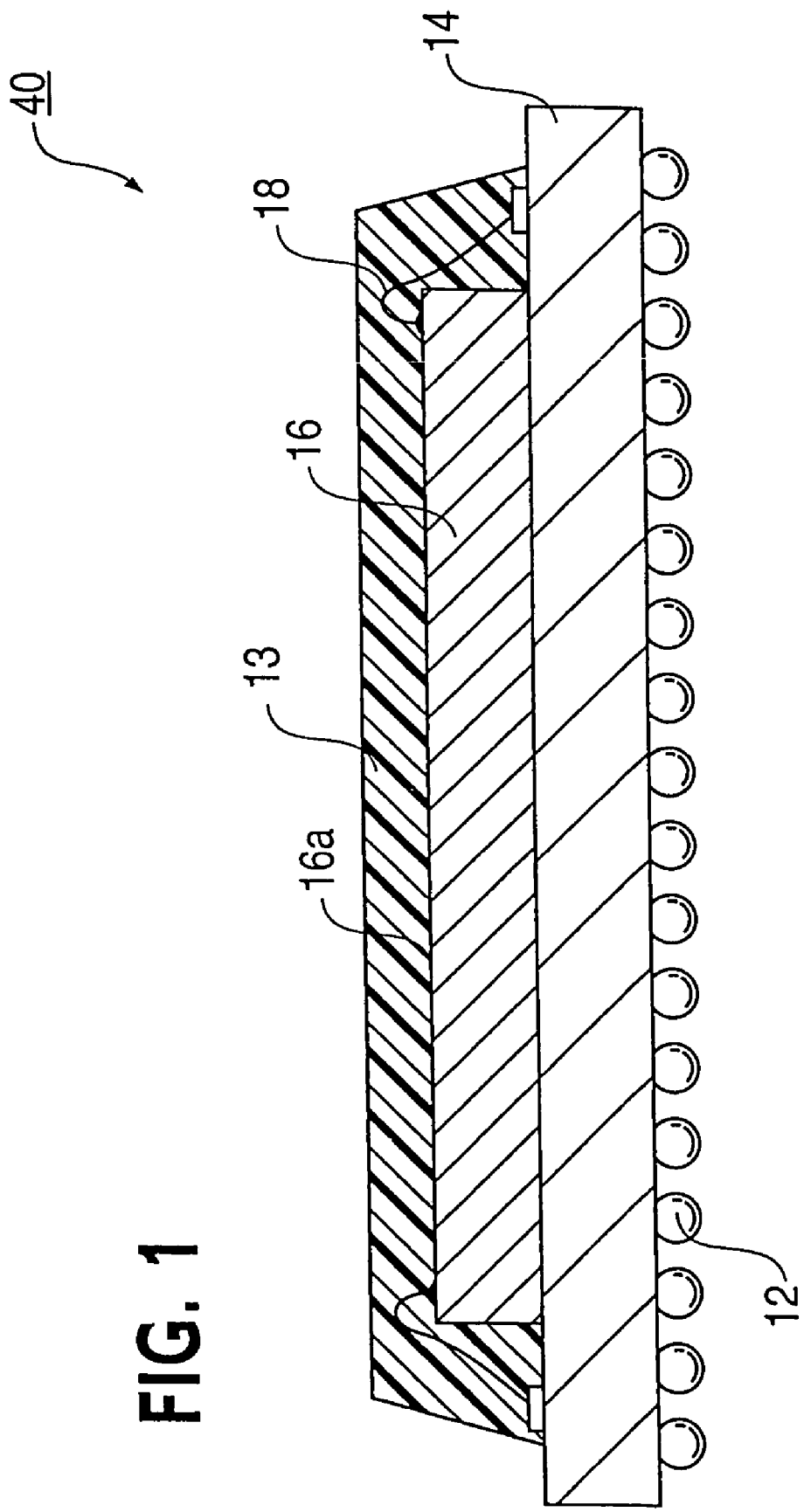
FIG. 1 is a cross sectional view showing a conventional semiconductor device.
Figure 2:
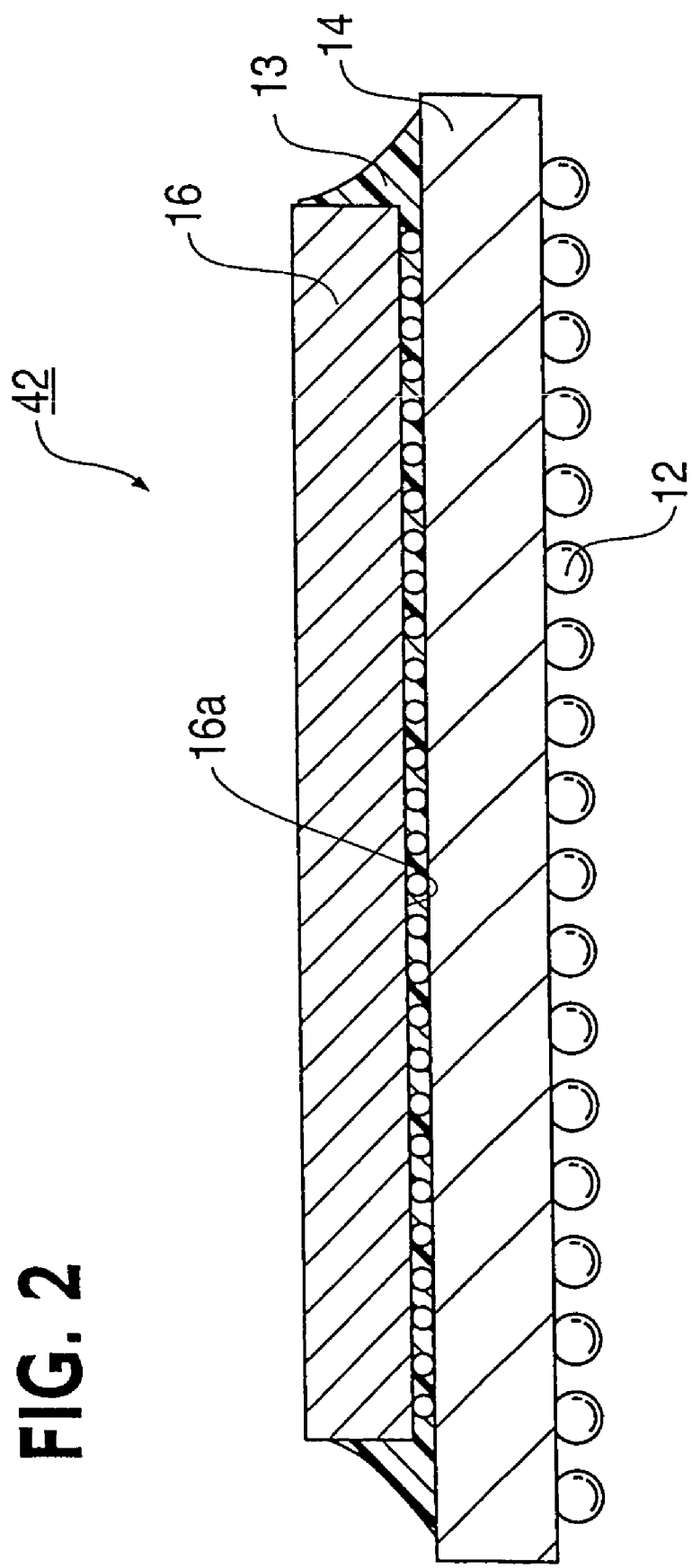
FIG. 2 is a cross sectional view showing a conventional semiconductor device.

A semiconductor device according to the present invention will be explained hereinafter with reference to FIG. 3 through FIG. 16. In order to simplify explanations, like elements are given like or corresponding reference numerals through this specification and figures.

Figure 3:
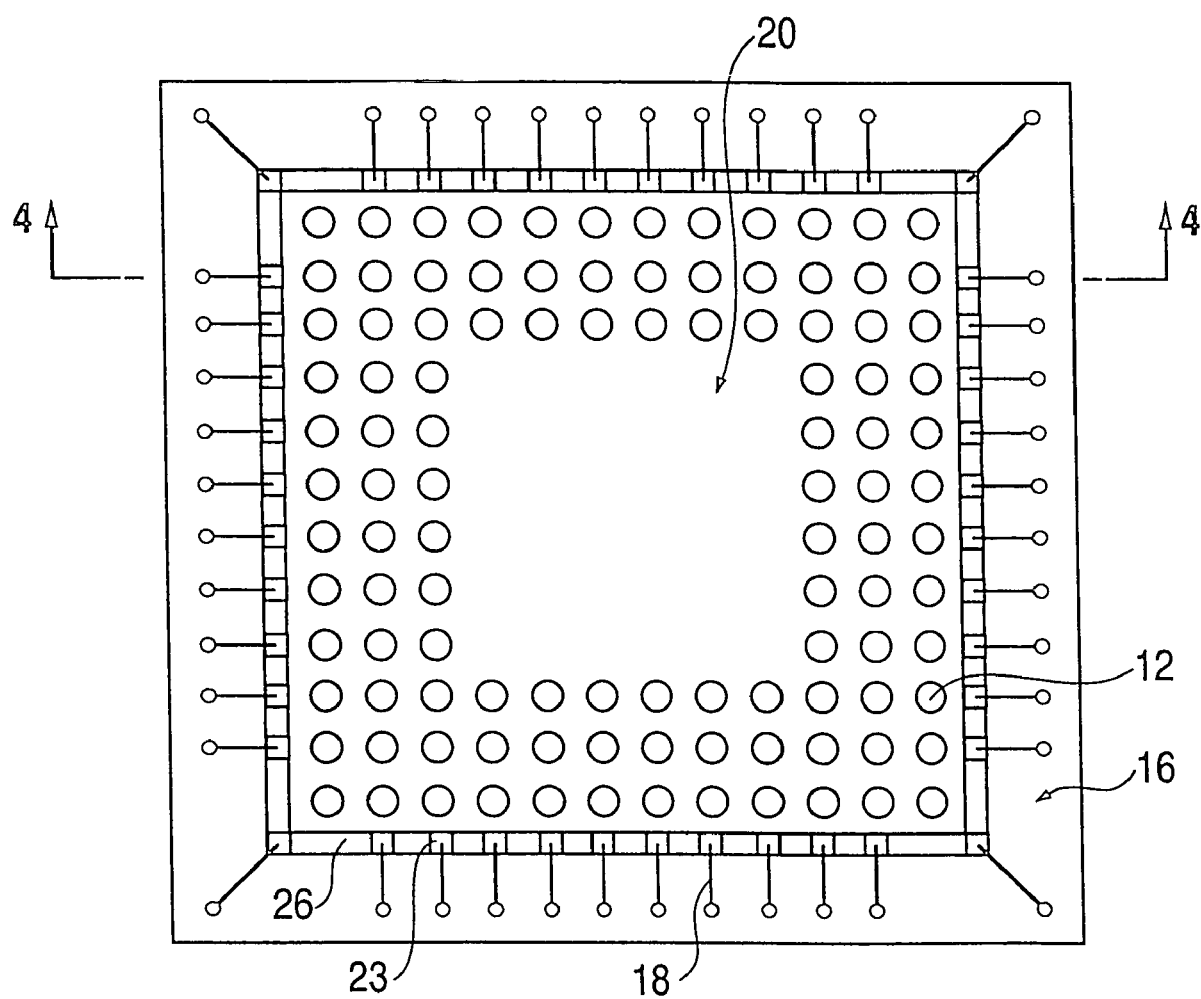
FIG. 3 is a top plan view showing a semiconductor device according to a first preferred embodiment of the present invention.
Figure 4:
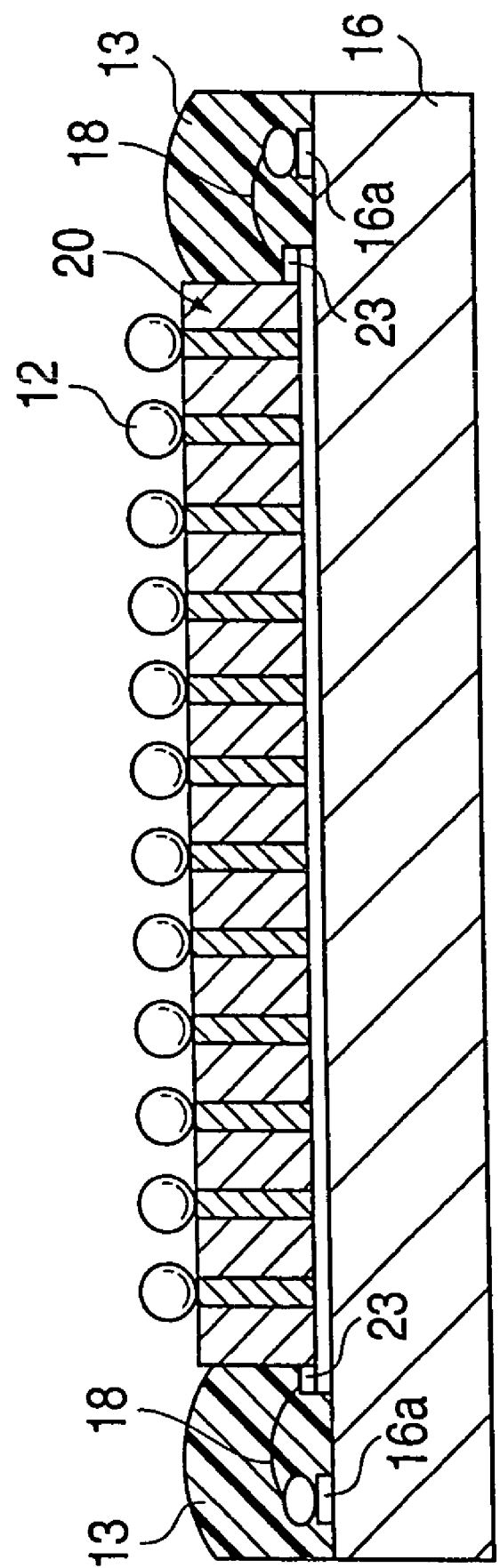
FIG. 4 is a cross sectional view taken on line 4—4 of FIG. 3.

FIG. 3 is a top plan view showing a semiconductor device according to a first preferred embodiment of the present invention. FIG. 4 is a cross sectional view taken on line 4—4 of FIG. 3.

As shown in FIG. 3 and FIG. 4, the semiconductor device of the first preferred embodiment has a semiconductor element 16 (i.e., a semiconductor chip) and a wiring substrate 20 (i.e., a wiring board or a package substrate).

The semiconductor element 16 has circuits, not shown in FIG. 3 and FIG. 4, which are formed in the center area of a front surface thereof and a plurality of electrode pads 16a (i.e., an electrode part) which are formed on the peripheral area of the front surface thereof.

Figure 5:
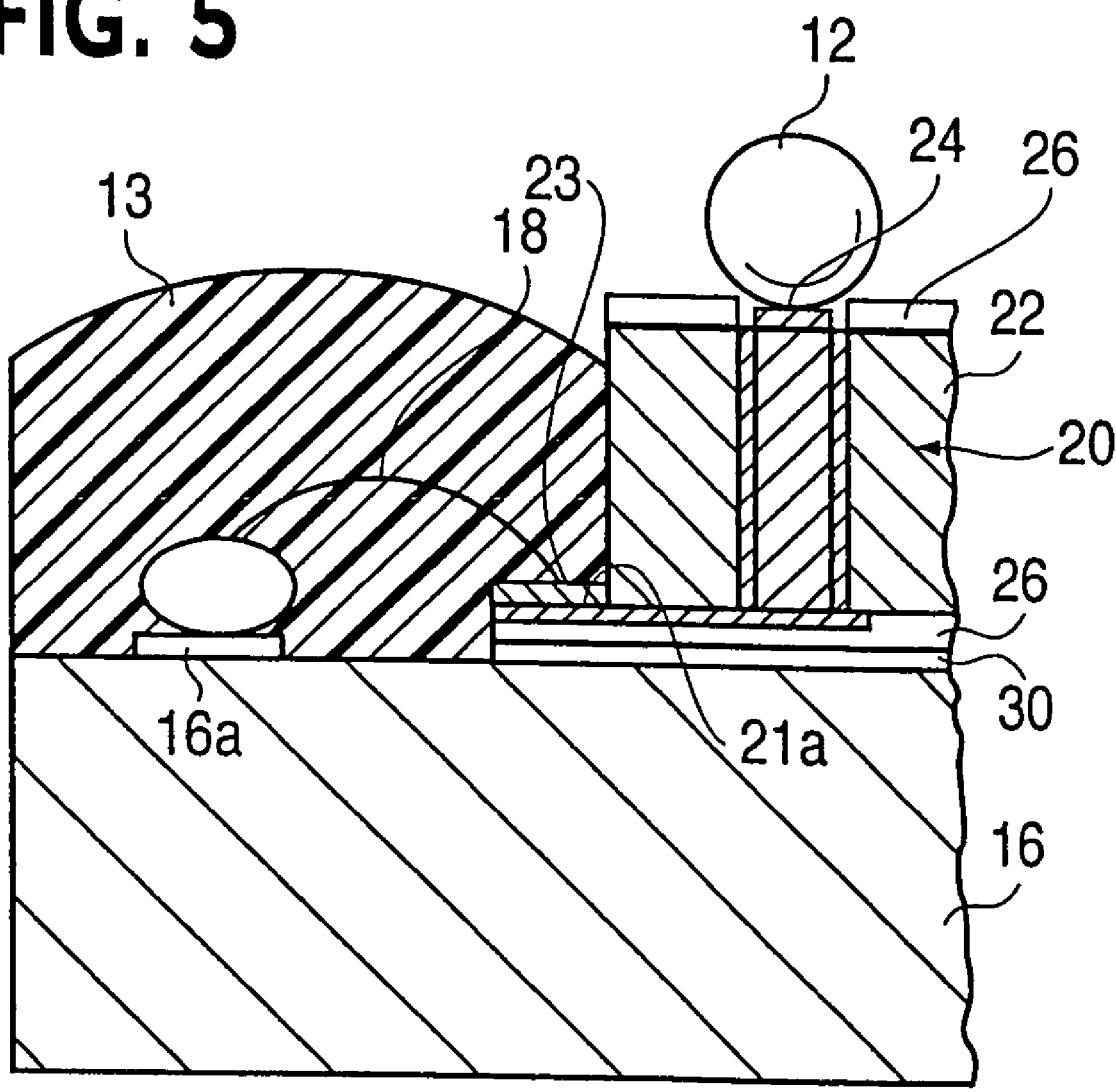
FIG. 5 is an expanded cross sectional view showing a part of FIG. 4.

The wiring substrate 20, having the size that is accommodated inside the peripheral area of the semiconductor element 16, is fixed on the center area of the semiconductor element 16 by an insulating adhesive 30 (refer to FIG. 5). The wiring substrate 20 is electrically connected to the semiconductor element 16 by bonding wires 18. An area (i.e., a bonding part) where the bonding wires 18 and the semiconductor element 16 are connected to each other is sealed with a resin 13 and thus the ar a is protected from an external environment.

The wiring substrate 20 is preferably made of a processed two-layer board, which has a base material 22 (herein after a glass epoxy base) comprising a glass epoxy resin and copper foils formed on both surfaces of the base material 22.

FIG. 5 is an expanded cross sectional view showing a part of FIG. 4.

As shown in FIG. 5, the wiring substrate 20 has electrode pads 24 which are formed on the front surface thereof and are used for solder balls 12 and wirings 21 which are preferably made of the patterned copper foil formed on the back surface thereof. The wirings 21 are electrically connected to the electrode pads 24 through conductive materials within through holes. A solder resist 26 is applied to an area of the front surface of the wiring substrate 20 where the electrode pads 24 are not formed. The solder resist 26 is also applied to the back surface of the wiring substrate 20 including the wirings 21. The solder resist 26 protects the surfaces of the wiring substrate 20.

The wiring substrate 20 also has wiring pads 23, which are formed, on a pad forming surface 21a. The pad forming surface 21a is formed to remove the copper foil of the front surface and the glass epoxy material 22 where they are located at the peripheral of the wiring substrate 20 by using a cutting tool, e.g., a drill. The wirings 21 on the pad forming surface 21a are plated with a copper and thus the plated portions thereof serve as the wiring pads 23. Each of the wiring pads 23 and the wirings 21 is associated with respective electrode pads 16a.

Next, a method of fabricating the semiconductor device according to the first preferred embodiment will be explained hereinafter. The method is also called a method of assembling the semiconductor device.

First, the rectangular semiconductor element 16 having the circuits, which are formed on the center area of the front surface thereof, and the electrodes 16a, which are formed on the peripheral area of the front surface thereof, is provided.

Next, the rectangular wiring substrate 20 having a length and breadth which is smaller than that of the semiconductor element 16 and which is accommodated inside the peripheral area of the semiconductor element 16 is provided.

Next, the wiring substrate 20 is fixed to about the center area of the semiconductor element 16 by applying the insulating adhesive 30 therebetween so that the front surface of the semiconductor element 16 faces upward.

After that, the wiring pads 23 which are disposed along the peripheral of the wiring substrate 20 are wire-bonded to the electrodes 16a of the semiconductor element 16 and thus they are electrically connected to each other.

Finally, the resin 13 is flowed onto the peripheral area of the front surface of the semiconductor element 16. Therefore, the area where the bonding wires 18 exist is sealed with the resin 13.

The semiconductor device is obtained from these steps.

As explained above, in the first preferred embodiment, since the positions of the wiring pads 23 of the wiring substrate 20 are close to the front surface of the semiconductor element 16 or the distances between the electrodes 16a and the wiring pads 23 are decreased compared to the conventional semiconductor device, it is not necessary to consider the bonding wires 18 contacting the edges of the wiring substrate 20. Therefore, the length of the bonding wires 18 can be shorter than those of the conventional semiconductor device. As a result, bonding wires 18 having a relatively low-height wire-bond loop profile can be used. This means that the possibility of imperfect contact or breaking of wire can be reduced.

Furthermore, the thickness of the resin 13 can be set within the thickness of the wiring substrate 20 because of the relatively low-height bonding wire 18. This means that the semiconductor device 40, having the thickness which corresponds to the thickness of the semiconductor element 16 and the wiring substrate 20 can be obtain d.

Furthermore, the semiconductor device having a length and breadth which is approximately identical to that of the semiconductor element 16 can be obtained.

Furthermore, since only the periphery of the wiring substrate 20 is sealed with the resin 13, the sealing process can be done precisely and easily.

Second Preferred Embodiment

A semiconductor device according to a second preferred embodiment will be explained hereinafter with reference to FIG. 6 through FIG. 8.

Figure 6:
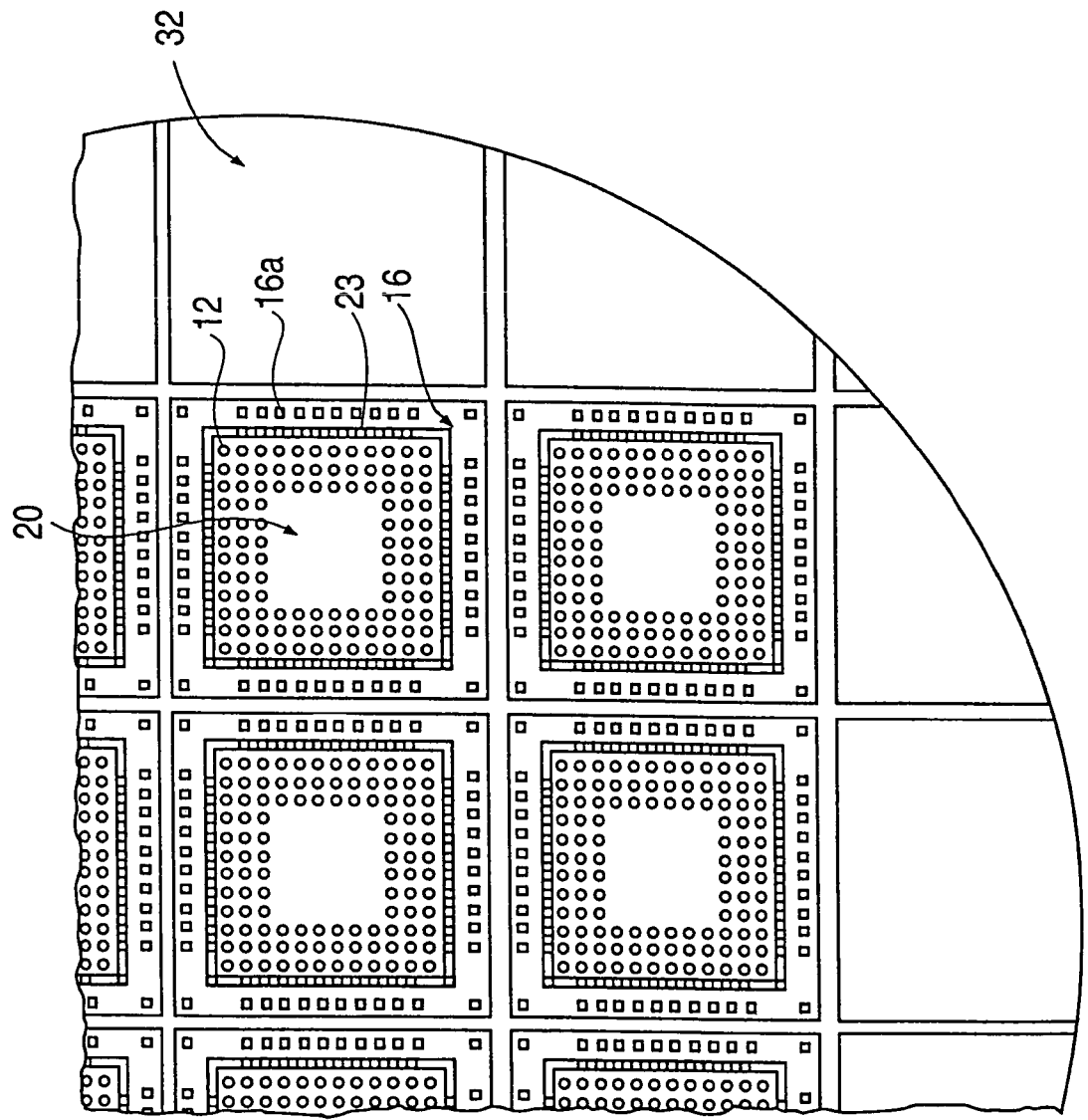
FIG. 6 is a top plan view showing a semiconductor device according to a second preferred embodiment of the present invention.
Figure 7:
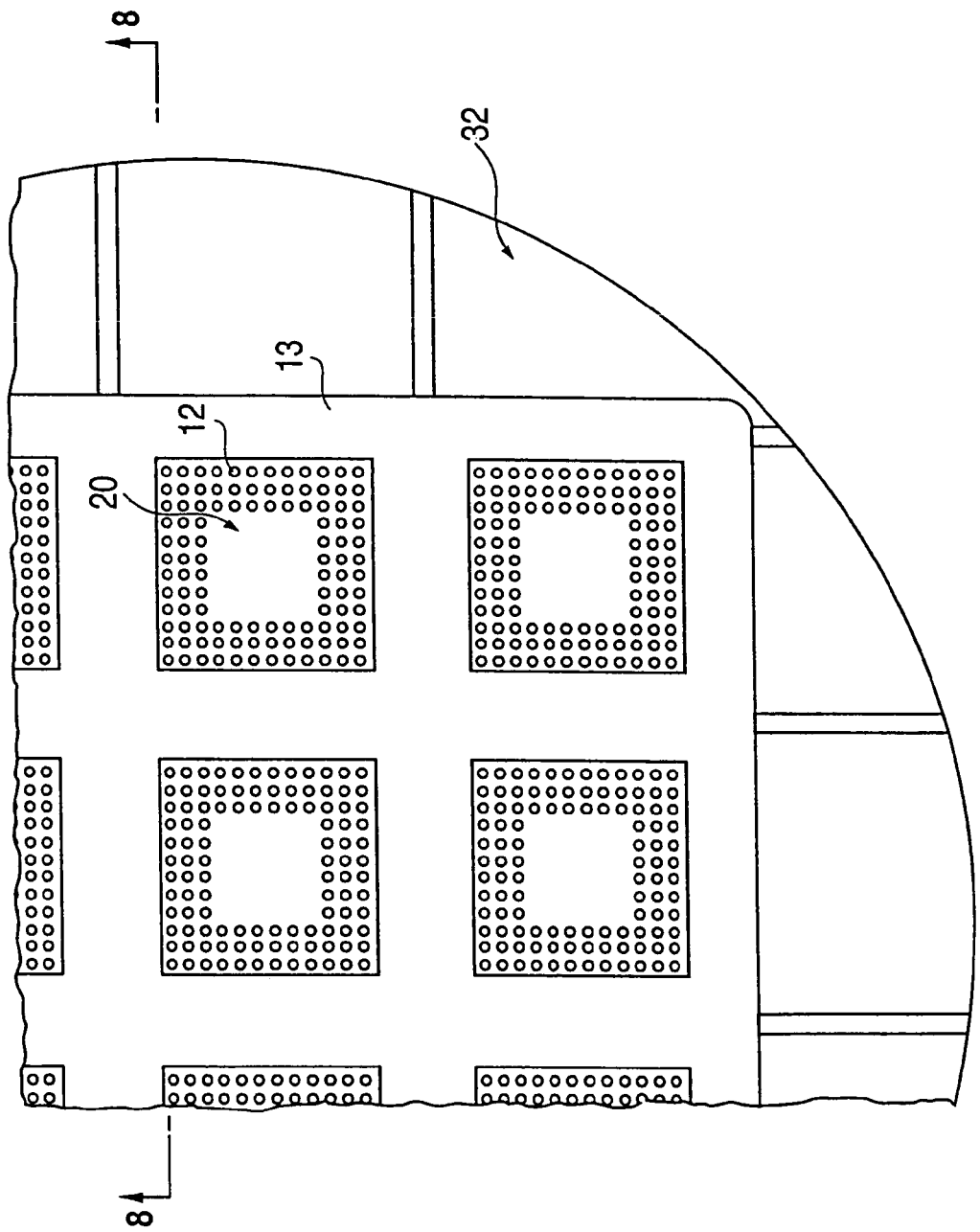
FIG. 7 is a top plan view showing a semiconductor device according to a second preferred embodiment of the present invention.
Figure 8:
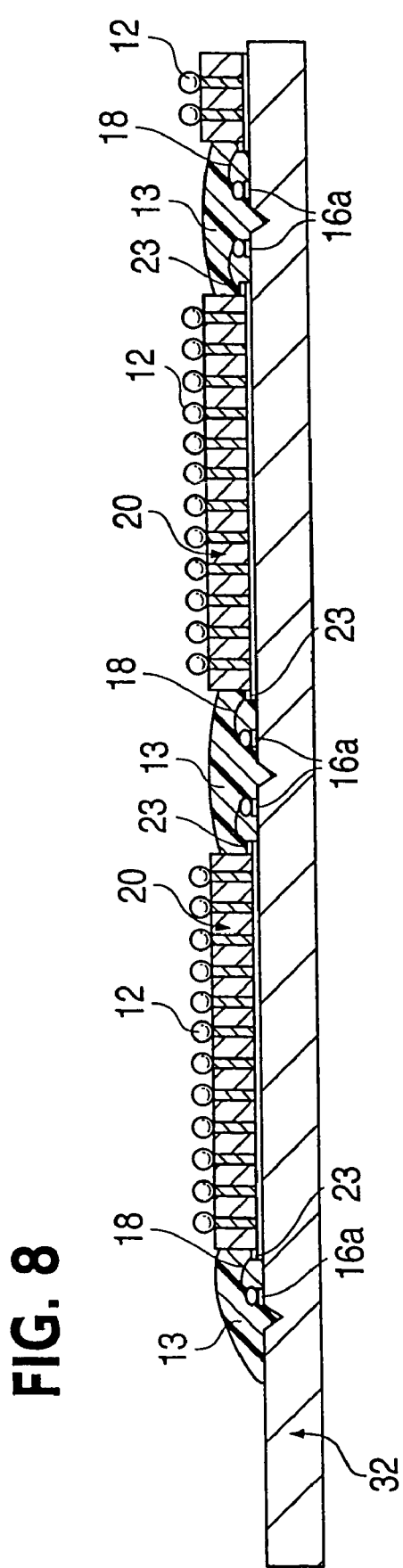
FIG. 8 is a cross sectional view taken on line 8—8 of FIG. 7.

FIG. 6 and FIG. 7 are top plan views showing semiconductor devices according to the second preferred embodiment. FIG. 8 is a cross sectional view taken on line 8—8 of FIG. 7.

The second preferred embodiment is directed to another method for fabricating the semiconductor device mentioned in the first preferred embodiment of the present invention.

As shown in FIG. 6, the wiring substrates 20 are fixed by the insulating adhesive 30 to areas which are surrounded by the respective sets of electrodes 16a in a state that a wafer 32 having the semiconductor elements 16 has not been separated into a plurality of pieces each having a respective one of the semiconductor elements 16.

Then, the wiring pads 23 which are disposed along the peripheral of the wiring substrates 20 are wire-bonded to the electrodes 16a of the semiconductor elements 16 and thus they are electrically connected to each other by the bonding wires 18.

After that, as shown in FIG. 5 and FIG. 6, the resin 13 is flowed onto an area between the wiring substrates 20 and into the sides of the outermost wiring substrates 20. Thus, the areas where the bonding wires 18 are located are sealed with resin 13.

After curing the resin 13, the wafer 32 is scribed and separated into the pieces each having a respective one of the semiconductor elements 16 and the wiring substrates 20. At this time, the semiconductor devices are obtained.

As mentioned above, since the wiring substrates 20 are mounted on the respective semiconductor elements 16 and the wiring pads 23 are wire-bonded to the electrodes 16a in the state that the wafer 32 has not been scribed, many semiconductor elements 16 can be handled all at once. Since the resin 13 is flowed onto the peripheral areas of the semiconductor elements 16 while the wafer 32 has not been separated into pieces, the scribing step can be the final step in obtaining the semiconductor devices. These means that an assembling period can be largely decreased and manufacturing-efficiency is improved.

Furthermore, appearance type failures do not occur, which result from an excess of resin hanging down.

Third Preferred Embodiment

A semiconductor device according to a third preferred embodiment will be explained hereinafter with reference to FIG. 9.

Figure 9:
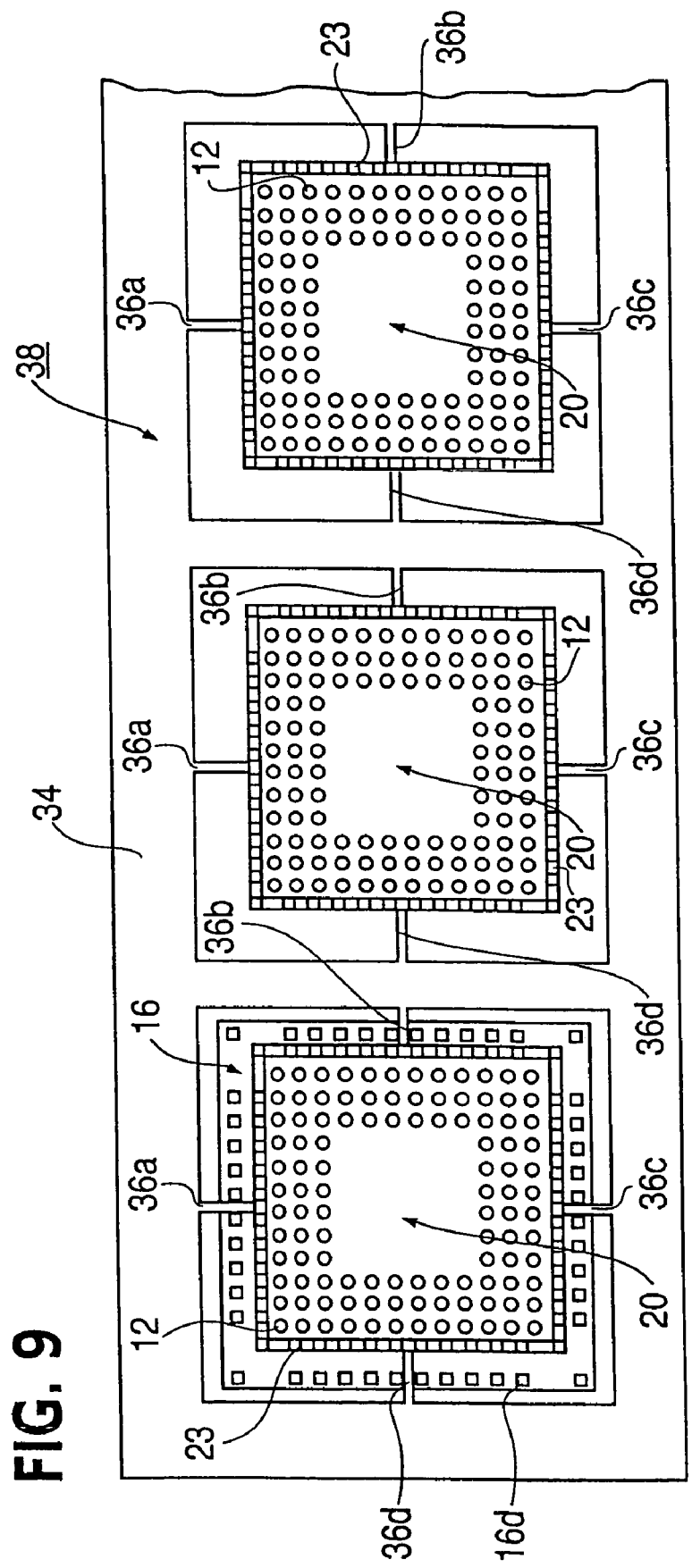
FIG. 9 is a top plan view showing a semiconductor device according to a third preferred embodiment of the present invention.

FIG. 9 is a top plan view showing a semiconductor device according to the third preferred embodiment of the present invention.

The third preferred embodiment is directed to another method for fabricating the semiconductor device mentioned in the first preferred embodiment of the present invention.

As shown in FIG. 9, a rectangular wiring substrate 38, which includes a frame part 34 and the wiring substrates 20, is used in the third preferred embodiment. The respective wiring substrates 20 are supported by supporters 36a, 36b, 36c, and 36d at the respective centers of their sides. The wiring substrates 20 and their supporters 36a, 36b, 36c, and 36d are coupled in series by the frame part 34.

First, the semiconductor elements 16 are successively fixed to the wiring substrate from one end to the other end by the insulating adhesive 30 (FIG. 5) so that the front surfaces thereof contact the back surfaces of the wiring substrates 20. At this time, the semiconductor elements 16 ar placed on the wiring substrates 20 so that the peripheral areas thereof on which the electrodes 16a are formed, do not touch the wiring substrates 20 and the frame part 34. Also, they are placed on the wiring substrates 20 so that the electrodes 16a do not touch the supporters 36a, 36b, 36c, and 36d or not overlap the supporters 36a, 36b, 36c, and 36d.

Next, the wiring pads 23 are wire-bonded to the electrodes 16a from one end of the wiring substrate 20 to the other end of the wiring substrate 20 in sequence.

After that, the resin 13 (FIG. 5) is flowed onto the sides of the wiring substrates 20 and the peripheral of the semiconductor elements 16. Thus, the areas where the bonding wires 18 are located are sealed with resin 13.

After curing the resin 13, the supporters 36a, 36b, 36c, and 36d are cut and thus the semiconductor elements 16 and the wiring substrates 20 are separated into pieces. At this time, the semiconductor devices are obtained.

As described above, since the rectangular wiring substrate 38 which includes the wiring substrates 20 coupled in series by the frame part 34 is used in the third preferred embodiment, a well known conveyor or the like which has an intermittent working mechanism can be used to process the wiring substrates 20 so that the wiring substrates 20 are processed from one end thereof to the other end thereof in sequence. That is, a highly manufacturing-efficiency can be achieved.

Furthermore, since such a well known conveyor can be adopted to fabricate the semiconductor device and thus it is not necessary to invest in special and new plant machinery, the semiconductor device can be fabricated in a more cost-effective manner.

Fourth Preferred Embodiment

A semiconductor device according to a fourth preferred embodiment will be explained hereinafter with reference to FIG. 10 through FIG. 12.

Figure 10:
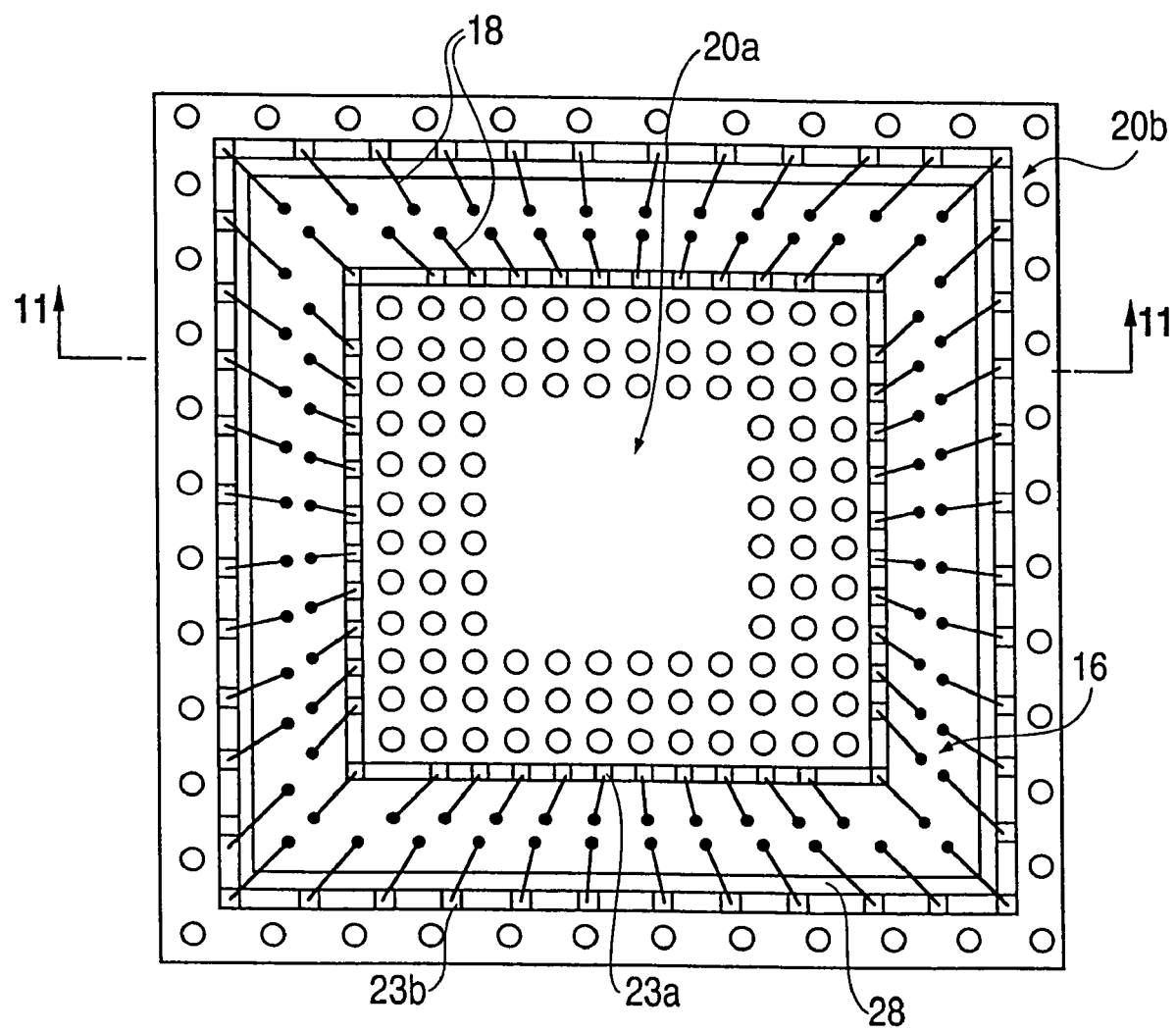
FIG. 10 is a top plan view showing a semiconductor device according to a fourth preferred embodiment of the present invention.

FIG. 10 is a top plan view showing a semiconductor device according to the fourth preferred embodiment. FIG. 11 is a cross sectional view taken on line 11—11 of FIG. 10. FIG. 12 is a top plan view showing a semiconductor element 16 (e.g., a semiconductor chip) according to the fourth preferred embodiment.

Figure 11:
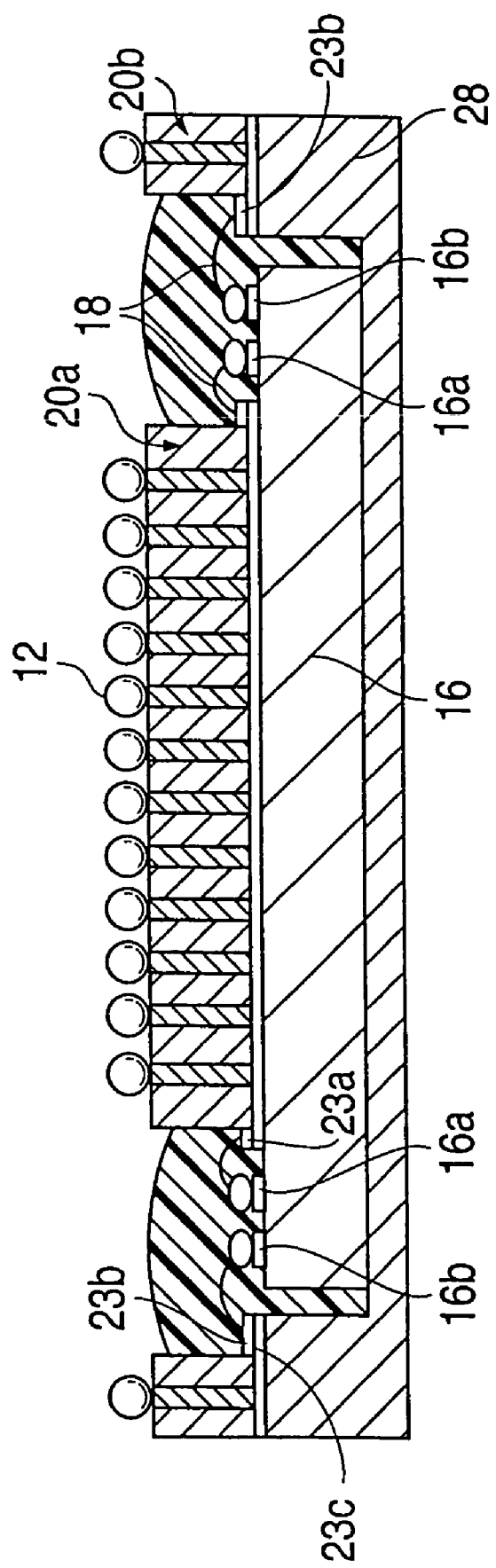
FIG. 11 is a cross sectional view taken on line 11—11 of FIG. 10.
Figure 12:
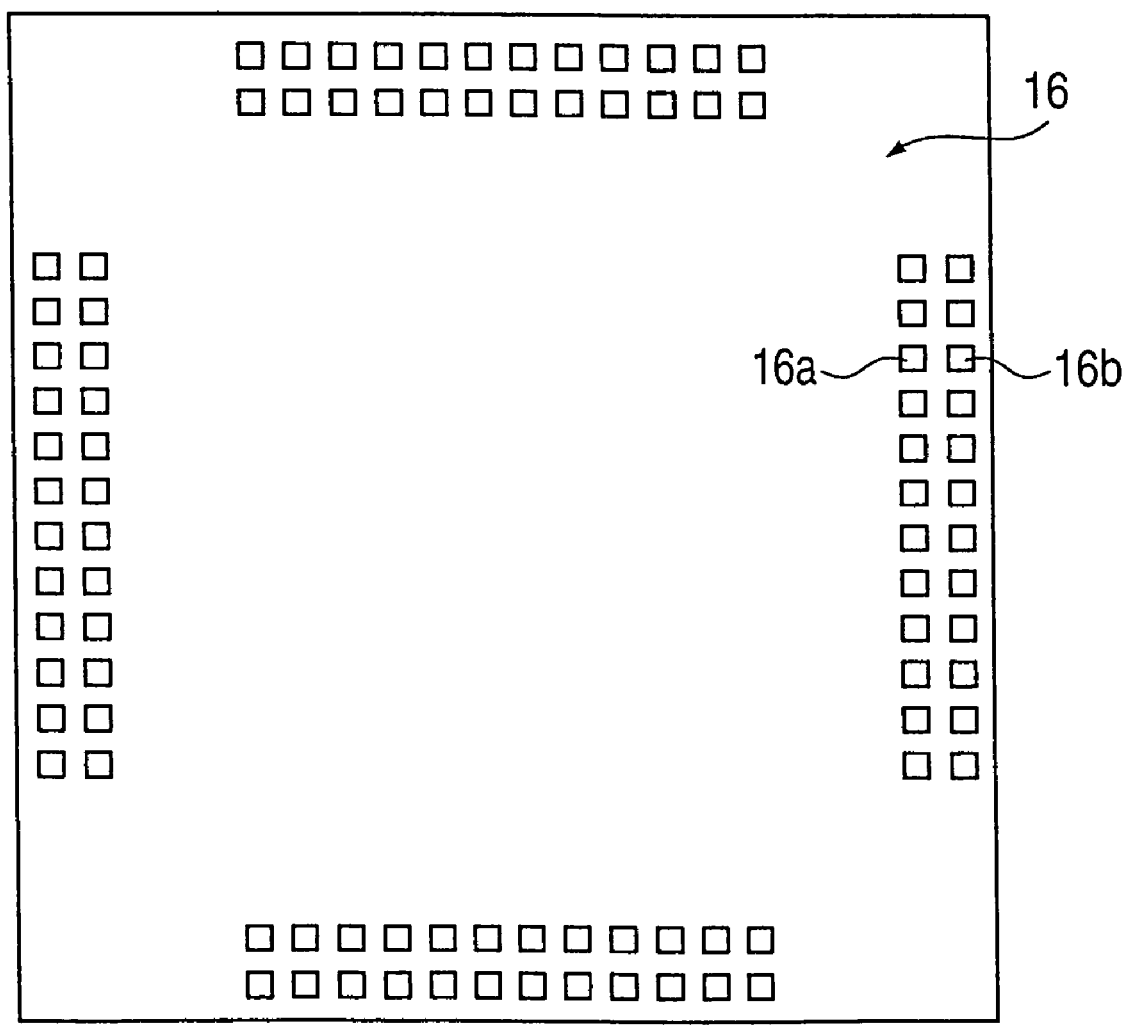
FIG. 12 is a top plan view showing a semiconductor element 16 according to a fourth preferred embodiment of the present invention.

As shown in FIG. 10 through FIG. 12, the semiconductor device has a first wiring substrate 20a (i.e., a wiring board or a package substrate), a second wiring substrate 20b (i.e., a wiring board or a package substrate), a element protect board 28 (i.e., a package substrate), and a semiconductor element 16 (i.e. a semiconductor chip)

The element protect board 28 is preferably made of a glass epoxy base material and has a concave portion positioned at the center thereof.

The second wiring substrate 20b has a frame shape and is stacked on the peripheral of the element protect board 28 so that the outer sides thereof are respectively aligned with corresponding outer sides of the element protect board 28.

The semiconductor element 16 has inside electrodes 16a and outside electrodes 16b, which are aligned in two rows along each side thereof as illustrated in FIG. 10. The semiconductor element 16 is set into the concave portion of the element protect board 28.

The first wiring substrate 20a, having a structure similar to that of the wiring substrate 20 in the first preferred embodiment, is fixed onto the center of the front surface of the semiconductor element 16 (i.e., an area surrounded by the inside electrodes 16a by unillustrated insulating adhesive.

The wiring pads 23a on the first wiring substrate 20a are wire-bonded to the inside electrodes 16a and the wiring pads 23b on the first wiring substrate 20b are wire-bonded to the outside electrodes 16b.

An area between the first wiring substrate 20a and the second wiring substrate 20b is filled with the resin 13. Thus, this area is protected from an external environment.

As will be explained below, the structure of the second wiring substrate 20b is similar to that of the wiring substrate 20.

The second wiring substrate 20b is preferably made of a two-layer board which comprises a glass epoxy base and copper foils formed on both surfaces thereof. A rectangular area, which is the center portion of the second wiring substrate 20b, is removed and thus it has the frame shape.

The second wiring substrate 20b has also electrode pads which are formed on the front surface thereof and are used for the solder balls 12 and wirings which are preferably made of a patterned copper foil formed on the back surface thereof. The wirings are electrically connected to these electrode pads through conductive materials within through holes.

An unillustrated solder resist is applied on an area of the front surface of the second wiring substrate 20b where the electrode pads are not formed. The solder resist is also applied on the back surface of the second wiring substrate 20b including the wirings. The solder resist protects the surfaces of the second wiring substrate 20b.

The second wiring substrate 20b also has wiring pads 23b, which are formed, on a pad forming surface 23c. The pad forming surface 23c is formed by using a cutting tool (e.g., a drill) to remove the copper foil of the front surface and the glass epoxy material at the inside edges of the second wiring substrate 20b. Portions of the pad forming surface 23c are plated with copper and thus the plated portions thereof serve as the wiring pads 23b. Each of the wiring pads 23b and the wirings formed on the back surface of the second wiring substrate 20b is associated with a respective electrode pad 16b.

In the element protect board 28, the concave portion thereof has a length and a breadth which is slightly larger than that of the semiconductor element 16, and a depth which is substantially the same as the thickness of the semiconductor element 16. The outer dimensions of the element protect board 28 and the second wiring substrate 20b are substantially the same. The second wiring substrate 20b is fixed to the element protect board 28 such that their outer edges are aligned. Since the first wiring substrate 20a has the same structure as the wiring substrate 20 of the first preferred embodiment, an explanation thereof is omitted here.

Next, a method of fabricating the semiconductor device will be explained hereinafter.

First, the rectangular semiconductor element 16 having the circuits, which are formed on the center area of the front surface thereof, and having the electrodes 16a and 16b, which are formed on the peripheral area of the front surface thereof, is provided.

Next, the rectangular wiring substrate 20a having a size which is smaller than that of the semiconductor element 16 and which is accommodated inside the inside electrodes 16a is provided.

Next, the first wiring substrate 20a is fixed to about the center area of the semiconductor element 16 by applying the insulating adhesive 30 therebetween so that the front surface of the semiconductor element 16 faces upward.

After that, the back surface of the semiconductor element 16 is adhered into the concave portion of the element protect board 28.

Then, the wiring pads 23a which are disposed along the peripheral of the first wiring substrate 20a are wire-bonded to the inside electrodes 16a of the semiconductor element 16 and the wiring pads 23b which are disposed along the inner sides of the second wiring substrate 20b are wire-bonded to the outside electrodes 16b of the semiconductor element 16.

Finally, the resin 13 is flowed into a space between the first wiring substrate 20a and the second wiring substrate 20b so that the surface thereof is level with the front surfaces of the first and second wiring substrates 20a and 20b. As a result, the area where the bonding wires 18 are located is sealed with the resin 13 and thus the semiconductor device is obtained.

As mentioned above, the fourth preferred embodiment has the same advantage as that of the first preferred embodiment and an additional advantage as follows.

Since the second wiring substrate 20b having wiring pads 23b are provided, a larger number of wiring pads than those of the first preferred embodiment may be provided on the semiconductor element 16. As a result, a large number of signals may be used in the semiconductor device and the number of pins (i.e., solder balls 12) can be increased.

This means that mounting density on a motherboard, i.e., a PC board, on which the semiconductor devices or the like are mounted, may be increased. This means also that the number of semiconductor devices on the motherboard can be increased. (that is, high density can be achieved)

Since the length and breadth of the semiconductor device is substantially the same as that of the second wiring substrate 20b, the overall size of the semiconductor device is relatively small for a device having a large number of wiring pads (i.e., solder balls). The overall size of the semiconductor device may be as small as possible.

Figure 13:
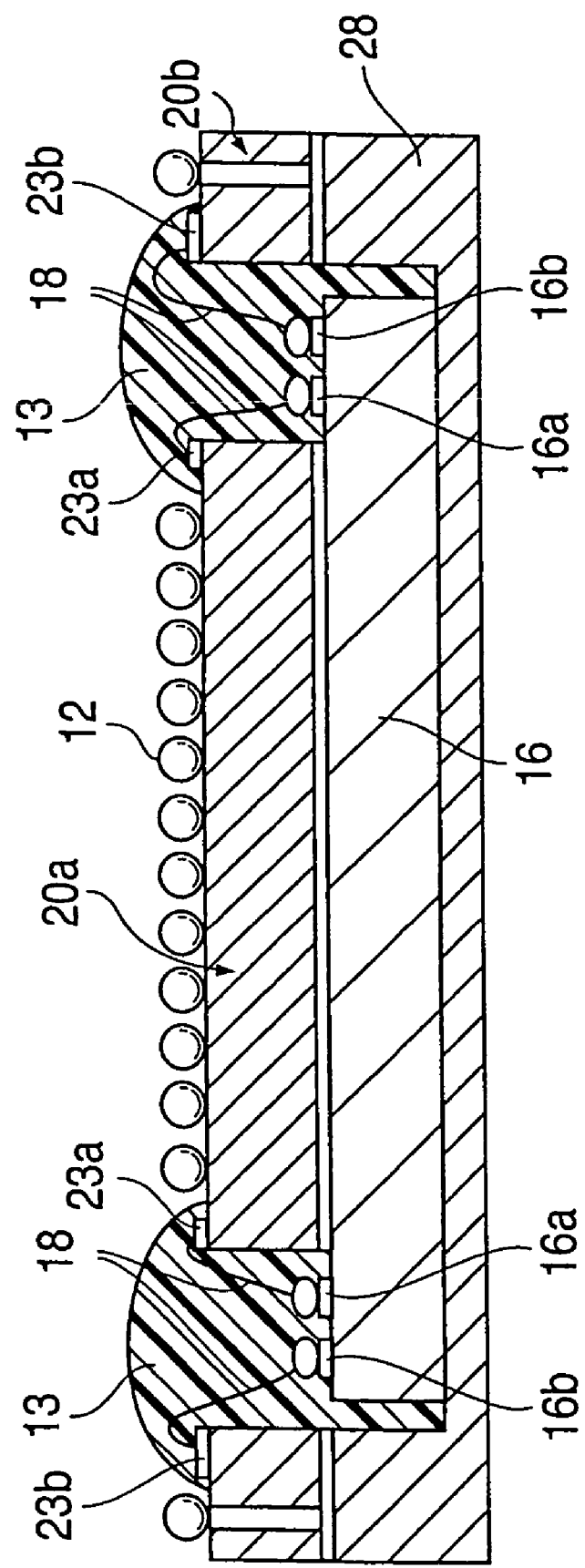
FIG. 13 is a cross sectional view of another example of a fourth preferred embodiment of the present invention.

Furthermore, another semiconductor device which has a larger number of wiring pads compared to the conventional semiconductor device and which may improve the mounting density is shown in FIG. 13.

FIG. 13 is a cross sectional view of another example of the fourth preferred embodiment.

The difference between FIG. 11 and FIG. 13 resides in locations where the wiring pads 23a and wiring pads 23b are formed. That is, as shown in FIG. 13, the wiring pads 23a and 23b are formed on the front surfaces of the first wiring substrate 20a and the second wiring substrate 20b, respectively. In this case, providing the through holes and the conductive material within the through holes which electrically connect between the solder balls 12 and the wiring pads 23a, 23b in the wiring substrates 20a, 20b is not necessary. Furthermore, the wiring pads 23a, 23b may be formed at the same time when the electrode pads for solder balls are patterned. Therefore, it is easy to produce the wiring substrates.

Fifth Preferred Embodiment

A semiconductor device according to a fifth preferred embodiment will be explained hereinafter with reference to FIG. 14 and FIG. 15.

Figure 14:
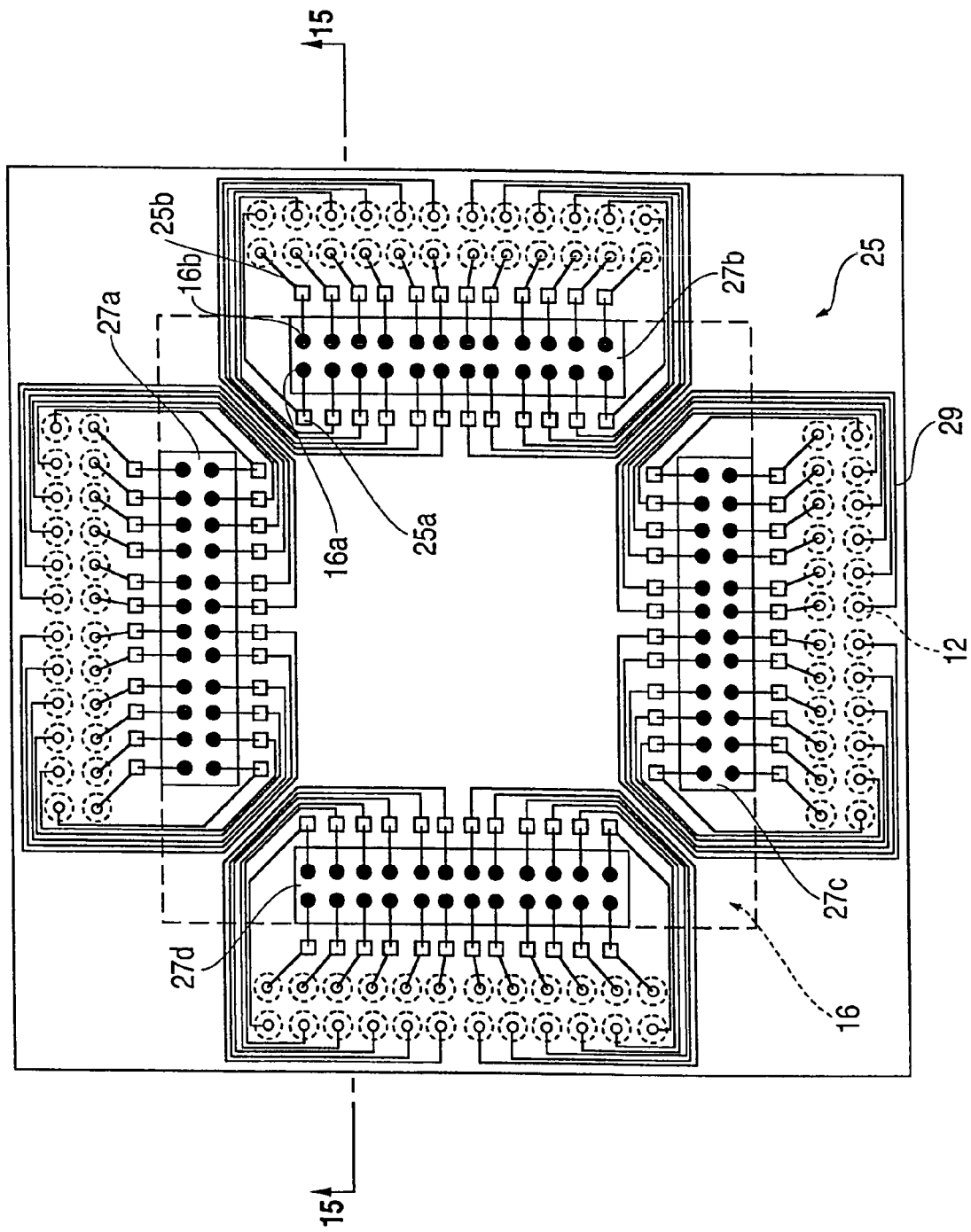
FIG. 14 is a top plan view showing a semiconductor device according to a fifth preferred embodiment of the present invention.

FIG. 14 is a top plan view showing a semiconductor device according to the fifth preferred embodiment. FIG. 15 is a cross sectional view taken on line 15—15 of FIG. 14.

Figure 15:
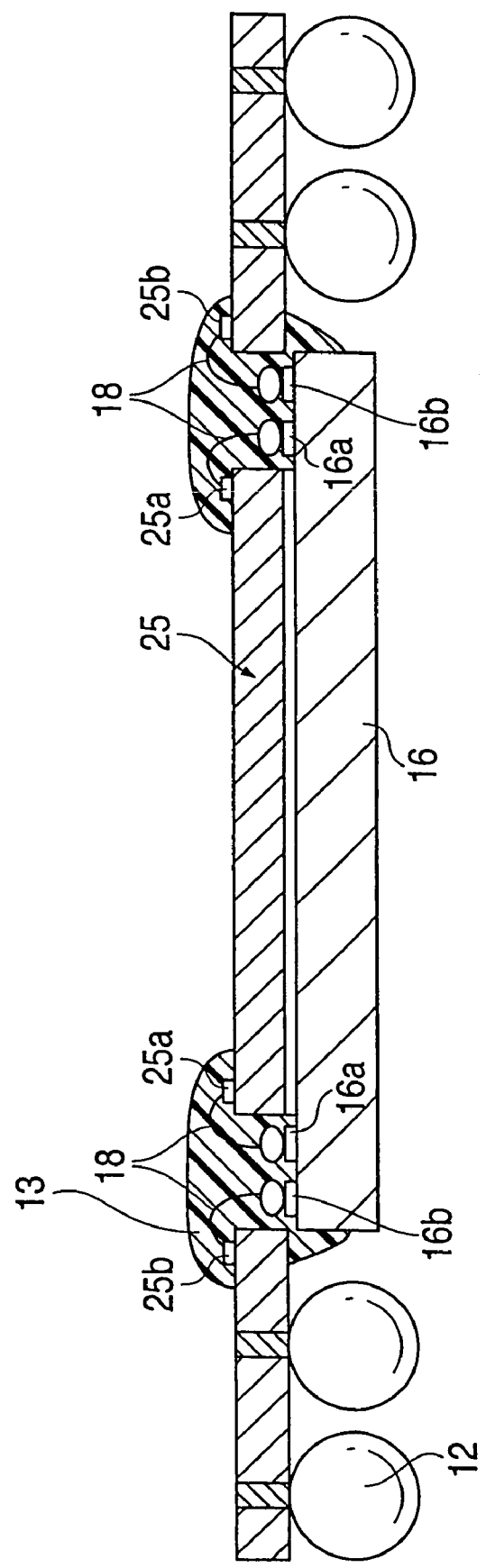
FIG. 15 is a cross sectional view taken on line 15—15 of FIG. 14.

As shown in FIG. 14 and FIG. 15, one of the features of the fifth preferred embodiment is to provide a wiring substrate 25 having openings 27a through 27d which are formed therein. The semiconductor element 16 is fixed on a back surface of the wiring substrate 25 so that its inside electrodes 16a and outside electrodes 16b are positioned at areas where the openings 27a through 27d are located. The solder balls 12 are also formed on the back surface of the wiring substrate 25. The thickness of the semiconductor device can be reduced by this structure.

The wiring substrate 25 is preferably made of a two-layer board which comprises a glass epoxy base and copper foils formed on both surfaces thereof. The wiring pads 25a and 25b are formed on a front surface of the wiring substrate 25 and disposed adjacent to and along the sides of the openings 27a through 27d respectively. Wirings 29, which are obtained by patterning the copper foil, are formed on the front surface of the wiring substrate 25. Inside wiring pads 25a and the outside wiring pads 25b are electrically connected to the corresponding solder balls 12 through conductive materials within through holes, which are defined in the wiring substrate 25.

Since the semiconductor element 16 has the same structure as that of the semiconductor element 16 of the fourth preferred embodiment, an explanation thereof is omitted here.

Next, a method of fabricating the semiconductor device will be explained hereinafter.

First, the rectangular semiconductor element 16 having the circuits, which are formed on the center area of the front surface thereof, and having the inside electrodes 16a and the outside electrodes 16b, which are formed on the peripheral area of the front surface thereof, is provided.

Next, the wiring substrate 25 having the openings 27a through 27d is provided.

Next, the semiconductor element 16 is adhered onto the center area on the back surface of the wiring substrate 25 by applying the insulating adhesive therebetween so that the inside electrodes 16a and the outside electrodes 16b are positioned at areas where the openings 27a through 27d are located.

After that, the inside wiring pads 25a which are disposed adjacent to and along first sides of the openings 27a through 27d are wire-bonded to the inside electrodes 16a of the semiconductor element 16, and the wiring pads 25b which are disposed adjacent to and along second sides of the openings 27a through 27d are wire-bonded to the outside electrodes 16b of the semiconductor element 16.

Finally, the resin 13 is flowed into the openings 27a through 27d and their periphery (i.e., on the inside and outside wiring pads 25a and 25b). As a result, the area where the bonding wires 18 are located is sealed with the resin 13 and thus the semiconductor device is obtained.

The fifth preferred embodiment has advantages which are explained as follows.

Since the wiring substrate 25 having openings 27a though 27d for exposing the inside and outside electrodes 16a, 16b is provided, and the solder balls 12 are formed on the back surface of the wiring substrate 25 on which the semiconductor element 16 is located, the total thickness (i.e., stack height) of the semiconductor device when it is assembled on the mother board or the like can be obtained by combining the thickness (i.e., height) of the solder ball 12 to the thickness of the wiring substrate 25. This means that a thinner package can be obtained.

Furthermore, a lager number of inside and outside wiring pads 25a, 25b may be disposed along the openings. As a result, a large number of signals may be used in the semiconductor device and the number of pins (i.e., solder balls 12) can be increased.

This means that mounting density on the motherboard, i.e., a PC board, on which the semiconductor devices or the like are mounted, may be increased. Thus, the number of semiconductor devices on the motherboard can be increased. (that is, a high density is achieved)

The overall size of the semiconductor device may be as small as possible, because the length and breadth of the semiconductor device is substantially the same as that of the wiring substrate 25.

Figure 16:
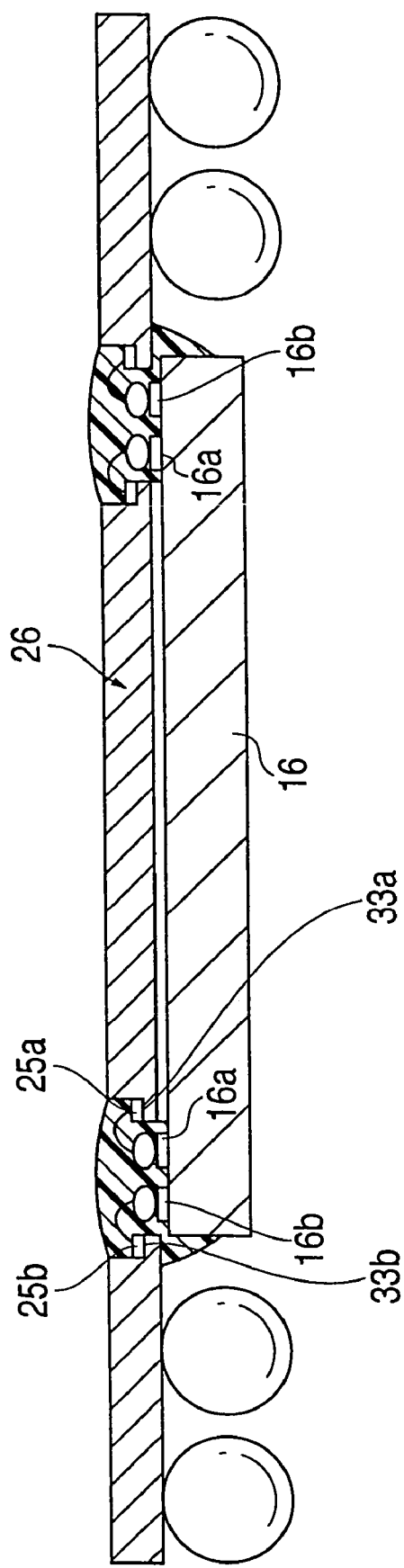
FIG. 16 is a cross sectional view of another example of a fifth preferred embodiment of the present invention.

Furthermore, another semiconductor device having a thickness which is thinner than that of the semiconductor device shown in FIG. 15 is shown in FIG. 16 as another example of the fifth preferred embodiment.

The difference between the semiconductor device as shown in FIG. 15 and that shown in FIG. 16 resides in the structure of the wiring substrate.

The wiring substrate 26 has wiring pads 25a, 25b, which are formed, on pad forming surfaces 33a, 33b respectively. The pad forming surfaces 33a, 33b are formed by using a cutting tool (e.g., a drill) to remove the copper foil of the front surfaces and the glass epoxy materials at the periphery of the openings 27a, 27b of the wiring substrate 26. Portions of the pad forming surfaces 33a, 33b are plated with a copper and thus the plated portions thereof serve as the wiring pads 25a, 25b. This structure is similar to that of the wiring substrate 20 as shown in FIG. 5.

In this case, since the sealed portions sealed with the resin 13 may be confined within the openings 27a through 27b, it is possible to prevent the solder balls 12 from being covered by the resin 13. Furthermore, the surface of the resin 13 in the front side may be positioned inside the front surface of the wiring substrate 26. This means that a semiconductor device having a thickness which is thinner than the semiconductor device shown in FIG. 15 may be obtained.

Furthermore, it is not necessary to provide the through holes and the conductive materials within the through holes which electrically connect between the solder balls 12 and the wiring pads 25a, 25b in the wiring substrate 26. Furthermore, the wiring pads 25a, 25b may be formed at the same time when the electrode pads for solder balls 12 are patterned. Therefore, it is easy to produce the wiring substrate 26.

As detailed above, the present invention may provide the semiconductor device having a size which is smaller than that of the conventional semiconductor device and having less manufacturing cost.

Furthermore, the present invention can provide the method of fabricating such a device.

While the preferred form of the present invention has been described, it is to be understood that modifications will be apparent to those skilled in the art without departing from the spirit of the invention.

The scope of the invention, namely, is to be determined solely by the following claims.

What is claimed is:

1. A semiconductor intermediate product, comprising:
   a semiconductor wafer having a plurality of device surface areas which are separated from one another by scribe lines, wherein each of the device surface areas includes a substrate mounting region and a plurality of surface electrodes adjacent the substrate mounting region;
   a plurality of wiring substrates fixed to the substrate mounting region of the plurality of device surface areas, respectively, wherein a peripheral surface region of each of the wiring substrates includes a plurality of electrode pads;

a plurality of wiring bondings which connect the plurality of electrode pads to the plurality of surface electrodes within each of the plurality of device surface areas; and a resin contained between adjacent wiring substrates so as to cover the scribe lines, the electrode pads, the wiring bonding, and the surface electrodes between the adjacent wiring substrates within the resin, wherein the peripheral surface region of each of the wiring substrates is stepped down from a central surface region of each of the wiring substrates, and wherein the resin covers the peripheral surface region of each of the wiring substrates and does not cover the central surface region of each of the wiring substrates.

2. The semiconductor intermediate product of claim 1, further comprising an insulating adhesive which fixes the plurality of wiring substrates to the substrate mounting region of the respective plurality of device surface areas.

3. A semiconductor wafer product comprising:

a semiconductor wafer having a plurality of chip areas and a plurality of scribe areas that divide the chip areas, each of the chip areas having a central area at which an integrated circuit is formed and an electrode area surrounding the central area, wherein a plurality of first electrode pads are formed in the electrode area;

a plurality of wiring substrates formed on the central areas, each of the wiring substrates having a plurality of external electrodes formed in a center area thereof and a plurality of second electrodes pads respectively electrically connected to the external electrodes, formed in a peripheral area thereof;

a plurality of bonding wires each of which respectively connects one of the first electrode pads with one of the second electrode pads; and a resin formed on the electrode areas, the peripheral areas of the wiring substrates and the scribe areas, so that the resin covers the first and second electrode pads and the bonding wires, wherein each of the wiring substrates include a plurality of through holes formed therethrough, a conductive material formed in the through holes and a plurality of wirings electrically connected to the second electrode pads.

4. The semiconductor wafer product of claim 3, wherein the peripheral area of each of the wiring substrates is stepped down from the center area of each of the wiring substrates, and wherein the resin covers the peripheral area of each of the wiring substrates and does not cover the center area of each of the wiring substrates.

5. The semiconductor wafer product according to claim 3, wherein a plurality of scribe lines are formed on the scribe areas.

6. The semiconductor wafer product according to claim 3, wherein each of the external electrodes are respectively electrically connected to the second electrode pads through the conductive material and the wirings.

7. The semiconductor wafer product according to claim 3, wherein a top surface of the resin has substantially the same level as top surfaces of the wiring substrates.

8. The semiconductor wafer product according to claim 3, wherein the external electrodes are formed in peripheral regions of the central areas of the wiring substrates.

9. The semiconductor wafer product according to claim 3, wherein the external electrodes are ball electrodes.

10. A semiconductor wafer product comprising:

a semiconductor wafer having a plurality of chip regions and scribe regions separating the chip regions, wherein each of the chip regions has a central region at which an integrated circuit is formed and a peripheral region at which a plurality of first electrode pads are formed;

a plurality of wiring substrates respectively formed on the central regions of the chip regions, wherein each of the wiring substrates has a plurality of external electrodes formed in a center area thereof and a plurality of second electrode pads respectively electrically connected to the external electrodes formed in a peripheral area thereof;

a plurality of bonding wires respectively connecting the first electrode pads with the second electrode pads; and a resin material formed on the semiconductor wafer except for the center areas of the wiring substrates, so that the resin material covers the first and second electrode pads and the bonding wires, wherein each of the wiring substrates include a plurality of through holes formed therethrough, a conductive material formed in the through holes and a plurality of wirings respectively electrically connected to the second electrode pads.

11. The semiconductor wafer product of claim 10, wherein the peripheral area of each of the wiring substrates is stepped down from the center area of each of the wiring substrates, and wherein the resin material covers the peripheral area of each of the wiring substrates and does not cover the center area of each of the wiring substrates.

12. The semiconductor wafer product according to claim 10, wherein a plurality of scribe lines are formed in the scribe regions of the semiconductor wafer.

13. The semiconductor wafer product according to claim 10, wherein each of the external electrodes are respectively electrically connected to the second electrode pads through the conductive material and the wirings.

14. The semiconductor wafer product according to claim 10, wherein a top surface of the resin material has substantially a same level as top surfaces of the wiring substrates.

15. The semiconductor wafer product according to claim 10, wherein the external electrodes are formed in peripheral regions of the center areas of the wiring substrates.

16. The semiconductor wafer product according to claim 10, wherein the external electrodes are ball electrodes.

* * * * *